United States Patent [19]

Sugawa et al.

[11] Patent Number: 4,972,243
[45] Date of Patent: Nov. 20, 1990

[54] PHOTOELECTRIC CONVERSION APPARATUS WITH SHIELDED CELL

[75] Inventors: Shigetoshi Sugawa, Atsugi; Nobuyoshi Tanaka, Tokyo; Toshiji Suzuki, Machida, all of Japan

[73] Assignee: Canon Kabushiki Kaisha, Tokyo, Japan

[21] Appl. No.: 325,023

[22] Filed: Mar. 20, 1989

Related U.S. Application Data

[63] Continuation of Ser. No. 89,774, Aug. 27, 1987, abandoned.

[30] Foreign Application Priority Data

Sep. 19, 1986 [JP] Japan .................. 61-219668

[51] Int. Cl.⁵ .............................. H01L 27/14
[52] U.S. Cl. ......................... 357/30; 357/32; 357/36; 357/43; 357/34; 330/69; 330/59; 250/578.1; 250/204; 250/211 R
[58] Field of Search ............ 357/30 S, 30 D, 30 G, 357/30 H, 30 P, 30 I, , 34, 32, 45, 36, 43; 330/69, 59; 250/578, 204, 211 R

[56] References Cited

U.S. PATENT DOCUMENTS

| | | | |
|---|---|---|---|
| 3,560,755 | 2/1971 | Blaise | 357/30 G X |
| 3,624,428 | 11/1971 | Weimer | 307/311 |
| 3,626,825 | 12/1971 | Years | 357/30 G X |
| 3,753,247 | 8/1973 | Rajchman | 357/32 X |
| 3,946,151 | 3/1976 | Kamiyama et al. | 178/7.1 |
| 3,969,751 | 7/1976 | Drukaroff et al. | 357/32 X |
| 4,293,877 | 10/1981 | Tsunekawa et al. | 358/213 |
| 4,300,163 | 11/1981 | Wada et al. | 358/163 |
| 4,455,574 | 6/1984 | Hashimoto et al. | 358/213 |
| 4,471,228 | 9/1984 | Nishizawa et al. | 250/578 |
| 4,587,415 | 5/1986 | Tsunekawa et al. | 250/204 |
| 4,651,016 | 3/1987 | Hirao | 357/30 D X |
| 4,683,441 | 7/1987 | Naylor | 330/69 |
| 4,686,554 | 8/1987 | Ohmi et al. | 357/30 |
| 4,698,599 | 10/1987 | Hedman | 330/69 X |
| 4,717,945 | 1/1988 | Yusa et al. | 357/30 H X |
| 4,751,559 | 6/1988 | Sugawa et al. | 357/30 |
| 4,791,469 | 12/1988 | Ohmi et al. | 357/30 |
| 4,814,846 | 3/1989 | Matsumoto et al. | 357/30 |

FOREIGN PATENT DOCUMENTS

| | | |
|---|---|---|
| 0132076 | 1/1985 | European Pat. Off. . |
| 0200532 | 11/1986 | European Pat. Off. .......... 357/30 P |
| 0201270 | 11/1986 | European Pat. Off. .......... 357/30 P |
| 0226338 | 6/1987 | European Pat. Off. . |
| 57-75469 | 5/1982 | Japan .................. 357/30 G |
| 59-195861 | 11/1984 | Japan .................. 357/32 |
| 252653 | 2/1985 | Japan . |
| 60-120556 | 6/1985 | Japan .................. 357/30 S |
| 62-113468 | 5/1987 | Japan . |
| 1169663 | 11/1969 | United Kingdom . |

*Primary Examiner*—William Mintel
*Attorney, Agent, or Firm*—Fitzpatrick, Cella, Harper & Scinto

[57] ABSTRACT

A photoelectric conversion apparatus has a plurality of photoelectric conversion cells. Each cell includes a semiconductor transistor having a control electrode area which in turn includes a plurality of main electrode areas for reading signals. The potential of the control electrode area is controlled to store carriers produced by optical pumping in the control electrode area, to read, from the main electrode area, a signal controlled by the storage voltage produced due to the storage, and to perform a refreshing operation to nullify the carriers stored in the control electrode area. A device is provided for performing a peak detection on the basis of signals from the main electrode area. At least one of the photoelectric conversion cells is shielded from light. The peak detection device performs the peak detection by detecting the difference between a peak signal obtained on the basis of a signal from the photoelectric conversion cells and a dark signal from the photoelectric conversion cells shielded from light.

28 Claims, 6 Drawing Sheets

PHOTOELECTRIC CONVERSION APPARATUS WITH SHIELDED CELL

This application is a continuation of application Ser. No. 089,774 filed Aug. 27, 1987, now abandoned.

BACKGROUND OF THE INVENTION

1. Field of the Invention

This invention relates to a photoelectric conversion apparatus which includes a plurality of photoelectric conversion cells each including a transistor having a control electrode area, wherein the potential of the control electrode area of each transistor is controlled to store carriers produced by optical pumping in the control electrode area, to read the stored voltage, and to nullify the stored carriers, and more particularly to a photoelectric conversion apparatus which is intended to perform precise peak detection.

2. Related Background Art

FIG. 1A is a schematic plan view of one example of a photoelectric conversion cell described in Japanese patent application No. 252653/1985, FIG. 1B is a cross sectional view taken along the line A—A of FIG. 1A and FIG. 1C is an equivalent circuit diagram of the cell.

In these Figures, an n-silicon substrate 1 has an $n^-$-epitaxial layer 3 formed thereon which has a p-base area 4 formed thereon which has $n^+$-emitter areas 5 and 5' formed thereon. The emitter areas 5 and 5' are connected to emitter electrodes 8 and 8', respectively.

In this example an insulating area 14 and the underlying $n^+$-area 15 constitutes a device separating area 2 which separates adjacent photoelectric conversion cells from each other Formed on p-base area 4 is an oxide film 6 on which is formed a capacitor electrode 7 with an insulating film 16 thereon. Formed on film 16 is a light shielding film 17 which shields light from the area on which the capacitor electrode and emitter electrode are formed with a photosensitive surface being formed in the main portion of p-base area 4. A protective insulating film 18 is formed o the light shielding film 17 and the insulating film 16 portion constituting the light-sensitive face. FIG. 1B also shows an $n^+$ layer 11 underlying layer 1, with an electrode 12 underlying layer 11.

In the basic operation, first assume that the p-base area 4 which is the base of a bipolar transistor is in an initial negative-potential state. When light enters the photosensitive face of this p-base area 4, electron-positive hole pairs will be produced, the positive holes of which are stored in p-base area 4, which changes the potential of p-base area 4 in the positive-going sense (storage operation).

Subsequently, a positive read voltage pulse is applied to capacitor electrode 7 and a read signal, namely, optical information corresponding to a change in the base potential during storage operation is outputted from emitter electrodes 8 and 8' in a floating state (read operation). At this time, the quantity of electric charge stored in p-base area 4 virtually does not decrease, so that non-destructive reading is possible.

In order to eliminate the positive holes stored in p-base area 4, emitter electrode 8 is grounded and a positive refresh pulse voltage is applied to capacitor electrode 7. This biases p-base area 4 forwardly relative to $n^+$-emitter areas 5 and 5' to thereby eliminate the positive holes stored. When the refresh pulse falls down, p-base area 4 returns to its initial negative-potential state (refresh operation). Thereafter, similarly, storage, read and refresh operations are repeated.

Such a double-emitter photoelectric conversion cell allows a signal to be read from either of both the emitters, so that the mean value or peak value can be easily taken using one signal and light measurement and/or peak value detection can be performed in parallel with the signal reading.

FIG. 2 is a circuit diagram showing one example of a photoelectric conversion apparatus using cells described in the above patent application No. 252653/1985. In FIG. 2, double-emitter photoelectric conversion cells S1-Sn are arranged in a line. Emitter electrodes 8 are connected to an output line 101 via vertical lines L1-Ln and transistors T1-Tn. Respective signals are read serially to signal output line 101, amplified by amplifiers and output outside as an output signal V0.

On the other hand, emitter electrodes 8' are connected to a common line 102, so that the peak values Vp of respective signals appear on the common line 102. The use of peak values Vp allows adjustment of the gain of the signal output amplifier and the durations of storage in the photoelectric conversion cells. Further, peak value detection is possible at the same time as reading from the emitter electrodes 8, so that the image pickup operation is speeded up.

However according to the conventional photoelectric conversion apparatus, noise components due to dark current in the photoelectric conversion cell are contained in the output signal, so that the apparatus has the problem that the peak value Vp does not correspond accurately to the peak signal in the photoelectric conversion cell.

SUMMARY OF THE INVENTION

In order to solve the above problems, a photoelectric conversion apparatus according to an embodiment of this invention comprises:

a plurality of photoelectric conversion cells, each including a semiconductor transistor having a control electrode area which in turn includes a plurality of main electrode areas for reading signals, wherein the potential of the control electrode area of each cell is controlled to store carriers produced by optical pumping in the control electrode area, to read, from the main electrode area, a signal controlled by the storage voltage produced due to the storage, and to perform a refreshing operation to nullify the carriers stored in the control electrode area;

means for performing a peak detection on the basis of signals from the main electrode area; and at least one of the photoelectric conversion cells being shielded from light whereby the peak detection is performed by detecting the difference between a peak signal obtained on the basis of a signal from the photoelectric conversion cells and a dark signal from the photoelectric conversion cells shielded from light.

By using the dark signal in the photoelectric conversion cell shielded from light as mentioned above, noise components due to the dark signal are eliminated from the peak signal obtained from the signal in the photoelectric conversion cell to thereby allow correct peak detection.

A photoelectric conversion cell shielded from light and a photoconductive conversion cell not shielded from light are referred to hereinafter as to the shielded-from-light bit and the open bit, respectively.

DETAILED DESCRIPTION OF THE PREFERRED EMBODIMENTS

Embodiments of this invention will now be described in more detail with reference to the drawings. First, the structure and basic operation of a photoelectric conversion cell used in the embodiments will now be described.

Figure 1A:
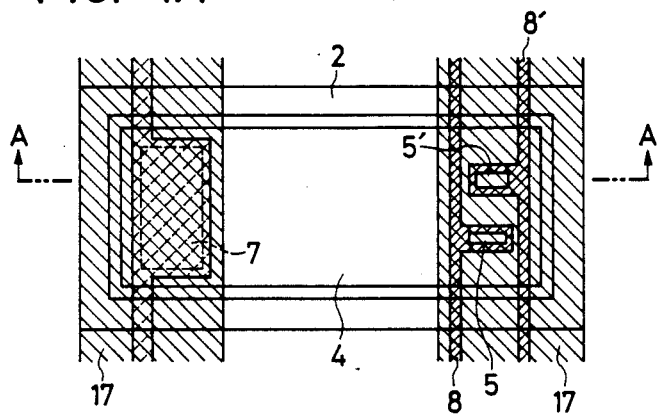
FIG. 1A is a schematic plan view of one example of a photoelectric conversion cell described in Japanese patent application No. 252653/1985.
Figure 1B:
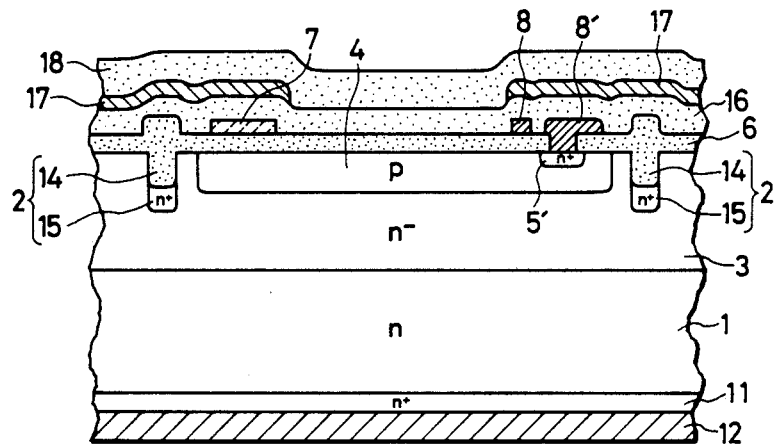
FIG. 1B is a cross-sectional view taken along the line A—A of FIG. 1A.
Figure 1C:
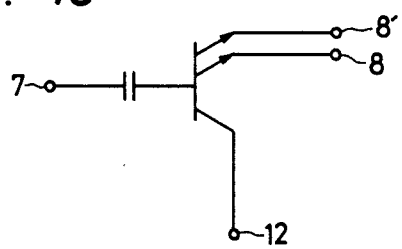
FIG. 1C is an equivalent circuit diagram of the cell shown in FIGS. 1A and 1B.
Figure 2:
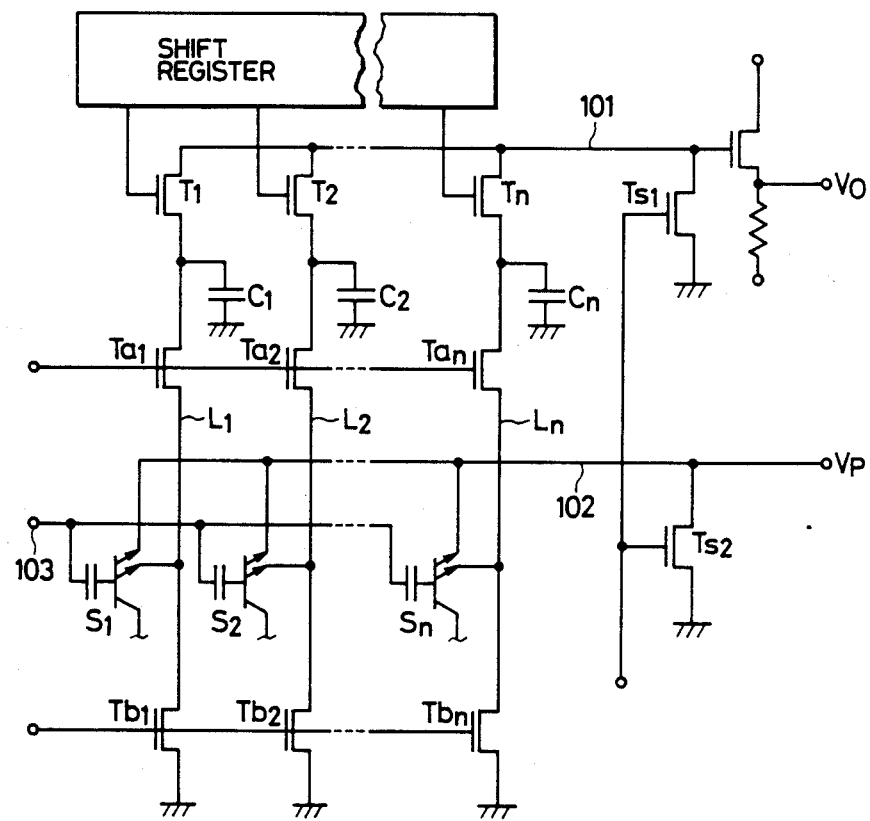
FIG. 2 is a circuit diagram showing one example of a conventional photoelectric conversion apparatus using cells described in Japanese patent application No. 252653/85.
Figure 3A:
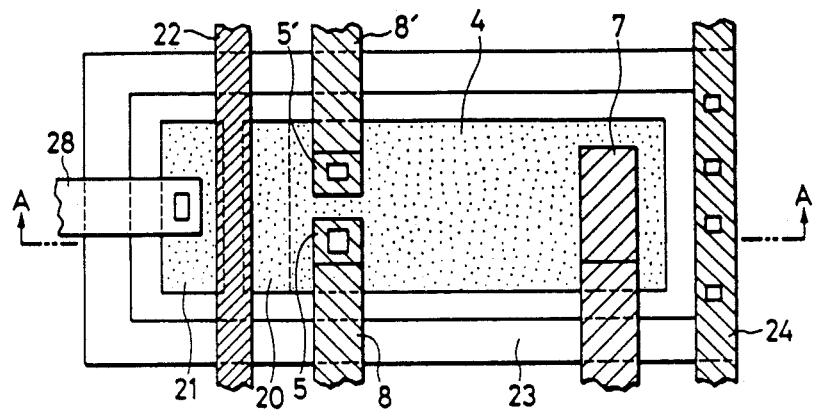
FIG. 3A is a schematic plan view of a photoelectric conversion cell used in one embodiment of a photoelectric conversion apparatus according to this invention.
Figure 3B:
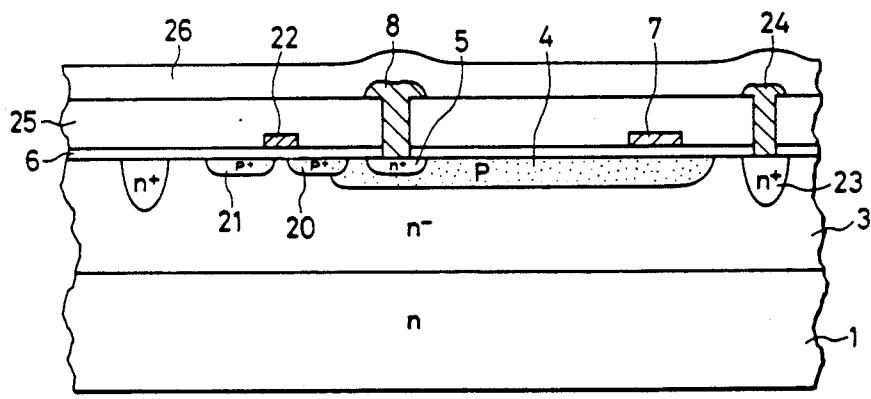
FIG. 3B is a cross-sectional view taken along the line A—A of FIG. 3A.
Figure 3C:
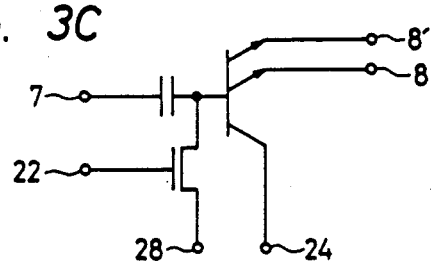
FIG. 3C is an equivalent circuit diagram of the cell of FIG. 3A.

FIG. 3A is a schematic plan view of a photoelectric conversion cell used in one embodiment of a photoelectric conversion apparatus according to this invention. FIG. 3B is a cross-sectional view taken along the line A—A of FIG. 3A. FIG. 3C is an equivalent circuit diagram of the cell. Like reference numerals are used to denote like areas and members in FIGS. 1 and 3. In FIG. 3, $n^-$-epitaxial layer 3 has p-base area 4 formed thereon which in turn has $n^+$ emitter areas 5 and 5' formed thereon.

Formed on p-base area 4 is oxide film 6 on which a capacitor electrode 7 is formed. Formed on $n^-$-epitaxial layer 3 is oxide film 6 on which a reset MOS transistor gate electrode 22 is formed. Capacitor and gate electrodes 7 and 22 are formed of polysilicon. $P^+$-areas 20 and 21 which are the source and drain areas of the reset MOS transistor are formed in a self-aligning manner with $p^+$-area 20 being joined to p-base area 4 and with $p^+$-area 21 having an Al electrode 28, connected thereto.

Formed on oxide film 6 is an inter-layer insulating layer 25 through which emitter electrodes 8 and 8' are connected to $n^+$-areas 5 and 5', respectively. Formed on oxide film 6 is a collector electrode 24 which is connected through $n^+$-area 23 to $n^-$-epitaxial layer 3 which is the collector area. Further, a passivation film 26 covers the insulating layer 25, emitter electrodes 8 and 8' and collector electrode 24.

In the case of the photoelectric conversion cell shielded from light, inter-layer insulating layer 25 has an insulating layer formed thereon on which insulating layer a shielded-from-light layer is formed. A passivation layer 26 is formed on the insulating layer 25, the emitter and collector electrodes.

The operation of the photoelectric conversion cell having such structure is basically the same as that of the related art except that the provision of the reset MOS transistor results in a refreshing operation at a higher speed than the related art. Namely, when a desired voltage is applied to the electrode 28 of the reset MOS transistor, and the refreshing operation is performed, first, the reset MOS transistor is turned on which maintains the potential of p-base area 4 constant regardless of the storage voltage. Thereafter, a refreshing pulse is applied to capacitor electrode 7 to thereby eliminate completely the carriers stored in p-base area 4 at high speeds.

Figure 4:
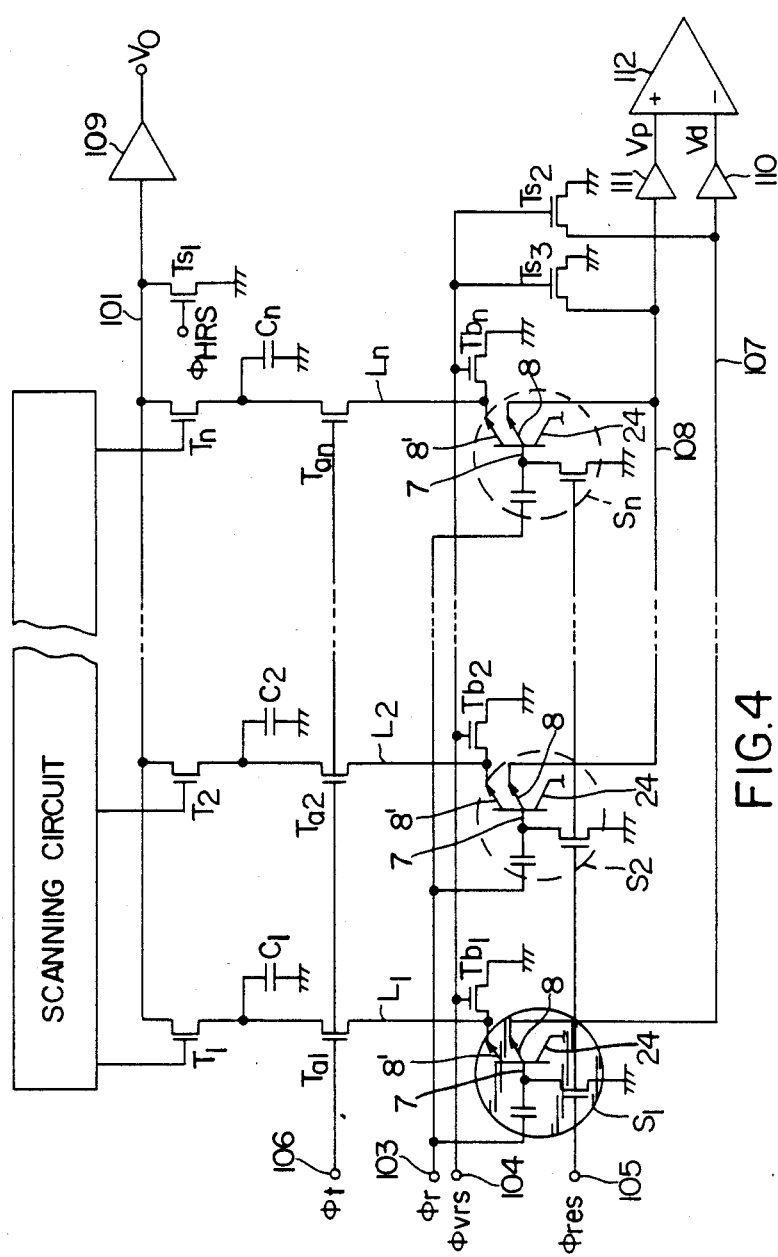
FIG. 4 is a circuit diagram of the first embodiment of a photoelectric conversion apparatus according to this invention.

FIG. 4 is a circuit diagram of a first embodiment of a photoelectric conversion apparatus according to this invention. In FIG. 4, the shielded-from-light bit S1 and open bits S2-Sn, each including the above photoelectric conversion cell, are arranged.

Capacitor electrodes 7 of the respective bits are connected together to a terminal 103 with a constant positive voltage being applied to collector electrodes 24. The electrodes 28 of the reset MOS transistors are grounded with gate electrodes 22 being connected together to a terminal 105.

Emitter electrodes 8' of the respective bits are connected to corresponding vertical lines L1-Ln which are connected via transistors Ta1-Tan to corresponding electric charge storage capacitors C1-Cn and via corresponding transistors T1-Tn to an output signal line 101. Output signal line 101 is grounded via a reset transistor Ts1 and also connected to a amplifier 109. The gate electrodes of transistors T1-Tn are connected to parallel output terminals of a scanning circuit and sequentially turned on in accordance with the scanning circuit.

Vertical lines L1-Ln are grounded via corresponding transistors Tb1-Tbn, the gate electrodes of which are connected together to a terminal 104. Emitter electrode 8 of shielded-from-light bit S1 is connected to a line 107 which is grounded via a transistor Ts2 and connected to an amplifier 110.

The respective emitter electrodes 8 of open bits S2-S2n are connected together to a line 108 which is grounded via a transistor Ts3 and also connected to an amplifier 111.

The respective gate electrodes of transistors Ts2 and Ts3 are connected to a terminal 104. The output terminal of amplifiers 110 and 111 are connected to input terminals of a differential amplifier 112. The operation of this embodiment will now be explained.

Refreshing Operation

First, a signal $\phi res$ is applied to terminal 105 to turn on the respective reset MOS transistors of the bits to thereby maintain the p-base areas 4 of all the bits at constant potential. Subsequently, a signal $\phi vrs$ is applied to terminal 104 to turn on transistors Tb1-Tbn, Ts2 and Ts3 to thereby ground the emitter electrodes 8 and 8' of all the bits. A refreshing pulse $\phi r$ is then applied to terminals 103 to eliminate the carriers stored in p-base area 4, as described above. It is to be noted that before these operations, the reset MOS transistors of the bits should be turned off.

Storage Operation

After a falling edge of the refreshing pulse $\phi r$, carriers corresponding to the illuminations of the respective light beams start to be stored in the respective p-base areas 4 of the open bits.

Read Operation

Figure 6:
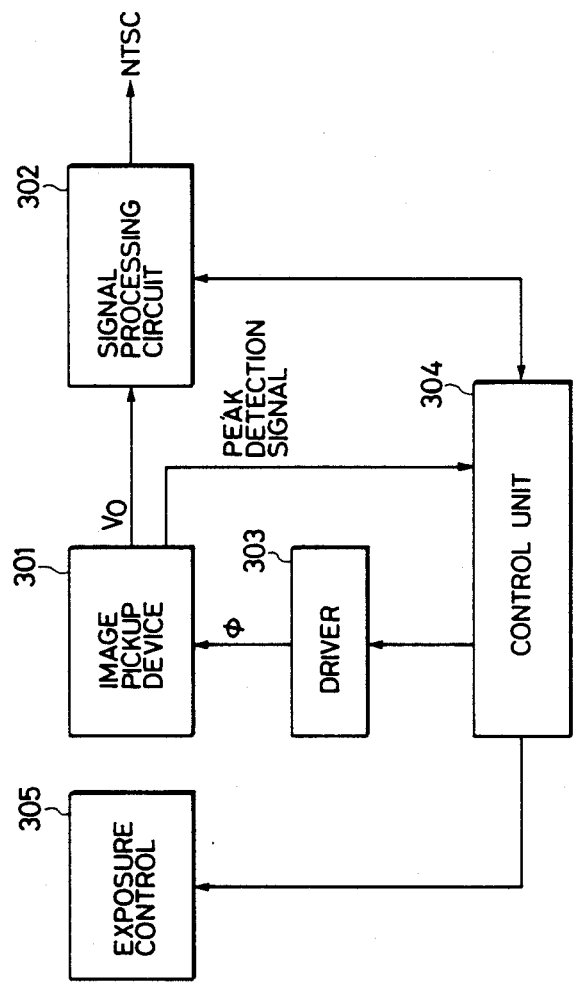
FIG. 6 is a schematic of one example of an image pickup apparatus using the above embodiment.

Thereafter, when a storage time T designated by a control unit 304 of FIG. 6 has passed, first, transistors Tb1-Tbn, Ts2 and Ts3 are turned off and the emitter electrodes 8 and 8' of the respective bits are rendered floating.

Subsequently, a signal $\phi t$ is applied to terminal 106 to turn on transistors Ta1-Tan and a read pulse is applied to terminal 103. Storage time T is from the falling edge of the pulse $\phi r$ to the rising edge of the read pulse $\phi t$. A dark signal is thereby read from the shielded-from-light bit to vertical line L1 and stored in capacitor C1, and signals are read from the respective open bits to the corresponding vertical lines L2-Ln and stored in the corresponding capacitors C2-Cn.

Subsequently, transistors Ta1-Tan are turned off, transistors T1-Tn are then sequentially turned on by the scanning circuit to read signals sequentially to output signal line 101 to thereby output the signals via amplifier 109. At this time, each time a signal is outputted, signal $\phi hrs$ turns on transistor Ts1 to refresh the remaining charges on output line 101.

Peak Detection

In parallel with the above read operation, the peak detection is formed. When a read pulse is applied to terminal 103 during reading operation, a dark signal is read from the shielded-from-light bit to line 107, signals are read from the open bits to lines 108. Since lines 108 are connected in common, the peak value of signals from the open bits S2-Sn appears on lines 108. Therefore, amplifiers 110 and 111 output a dark signal Vd and a peak signal Vp, respectively, and differential amplifier 112 calculates the difference $|Vp-Vd|$ between these signals to thereby provide a peak detection signal free from noise components due to the dark signal.

Figure 5:
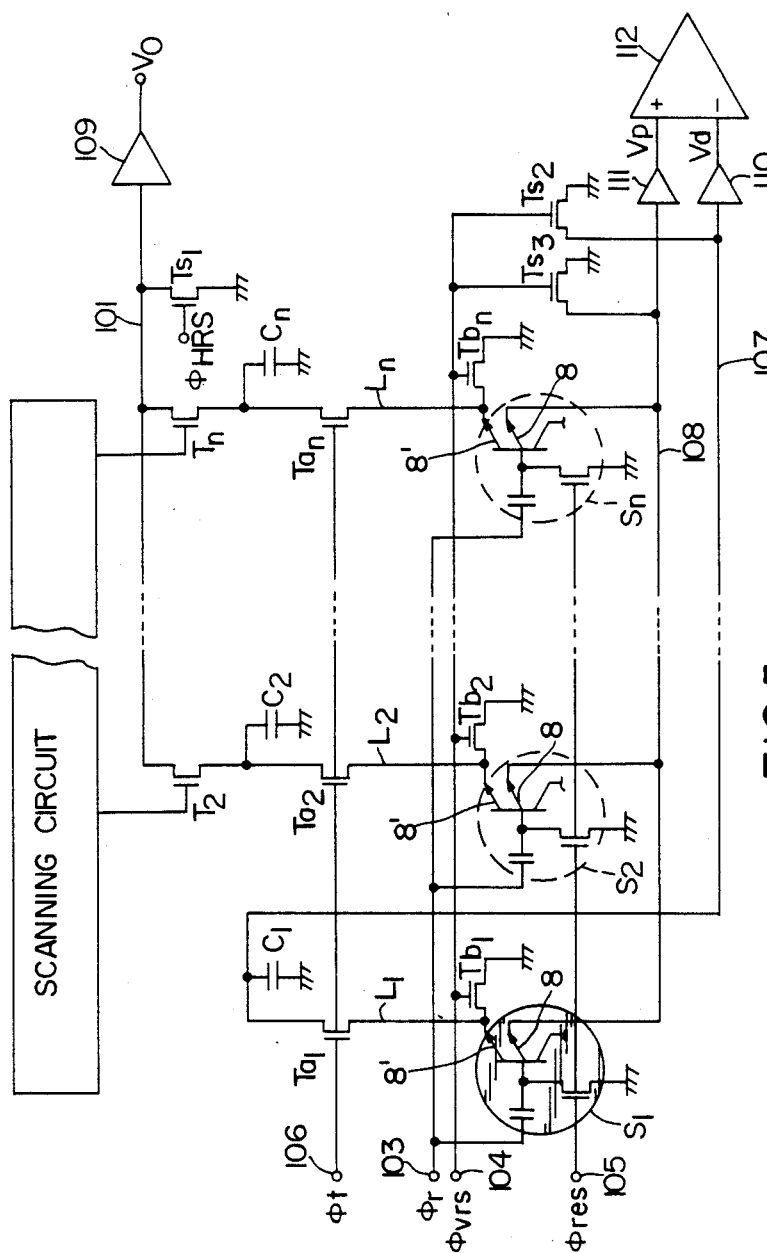
FIG. 5 is a circuit diagram of a second embodiment of this invention.

FIG. 5 is a circuit diagram of a second embodiment of this invention. Like reference numerals are used to denote like circuit blocks or elements in the first and second embodiments.

In FIG. 5, the emitter electrode 8' of the shielded-from-light bit S1 is connected to a charge storage capacitor C1 and a line 107 via a vertical line L1 and a transistor Ta1. Therefore, as in other open bits, a dark signal from the shielded-from-light bit is stored in capacitor C1 during a read operation and amplified by amplifier 110 and outputted as a dark signal Vd.

Emitter electrode 8 of shielded-from-light bit S1 is connected to a line 108 together with the respective emitter electrodes 8 of the open bits S2-Sn.

As mentioned above, since the circuit structure of emitter electrodes 8 and 8' of shielded-from-light bit S1 is similar to that of the open bits S2-Sn, the base parasitic capacitance of the shielded-from-light bit S1 becomes the same as that of other open bits, and since the emitter electrodes 8 of all the bits are connected to line 108, the quantities of feedback from the emitter electrodes 8 are equal for all the bits.

As a result, although the storage time and temperature change, no relative fluctuations in signal output between shielded-from-light bit S1 and open bits S2-Sn will be produced. Therefore, a dark signal from shielded-from-light bit S1 becomes a stabilized reference in peak detection and the calculation of the difference $|Vp-Vd|$ between both the signals by differential amplifier 112 provides a further precise peak detection compared to the first embodiment.

While the above respective embodiments have been described for a line sensor, of course, area sensors may be similarly constructed to obtain similar effects. While in the above embodiment, only a single shielded-from-light bit is shown as being used, a plurality of shielded-from-light bits may be used as needed.

FIG. 6 is a schematic of one example of an image pickup device using the above embodiment. In FIG. 6, an image pickup device 301 may have the structure of each of the above embodiments. The output signal V0 of image pickup device 301 is subjected to a processing such as a gain adjustment by a signal processing circuit 302 and output as a standard television signal such as an NTSC signal.

A driver 303 supplies various pulses $\phi$ to a drive image pickup device 301 and operates under the control of control unit 304. The peak detection signal output from a differential amplifier 112 of image pickup device 301 is input to control unit 304 which controls the gain of the signal processing circuit 302, the storage time of image pickup device 301 and an exposure control means 305 so that a signal level formed by image pickup device 301 becomes optimal.

As described above, the present embodiments are capable of correct peak detection, and performing an appropriate image pickup.

As described above in detail, the photoelectric conversion apparatus according to this invention utilizes a dark signal from a photoelectric conversion cell shielded from light to eliminate noise components from a peak signal based on a signal from the photoelectric conversion cell to thereby provide correct peak detection.

We claim:

1. An image pickup apparatus comprising:
   (a) a plurality of photoelectric conversion elements which are irradiated by incident light, and at least one photoelectric conversion element which is shielded from the incident light, each of said photoelectric conversion elements comprising a transistor including a base, a collector and first and second emitters, the first emitters of said plurality of photoelectric conversion elements which are irradiated by the incident light being commonly connected;
   (b) first output means for outputting a signal corresponding to a difference between an output of said first emitters connected commonly and an output of one emitter of said photoelectric conversion element which is shielded from light; and
   (c) second output means for outputting outputs of the second emitters of said plurality of photoelectric conversion elements which are irradiated by the incident light.

2. An image pickup apparatus according to claim 1, further comprising first accumulation means for respectively accumulating outputs of said second emitters of said plurality of photoelectric conversion elements which are irradiated by the incident light.

3. An image pickup apparatus according to claim 2, further comprising readout means for reading out said outputs accumulated in said first accumulation means in a predetermined order.

4. An image pickup apparatus according to claim 3, further comprising signal processing means for processing a signal read out from said first accumulation means.

5. An image pickup apparatus according to claim 4, further comprising means for controlling a gain of said signal processing means according to the signal output by said first output means.

6. An image pickup apparatus according to claim 2, wherein said first accumulation means includes a capacitor.

7. An image pickup apparatus according to claim 2, further comprising second accumulation means for accumulating an output of the second emitter of said photoelectric conversion element which is shielded from light.

8. An image pickup apparatus according to claim 7, further comprising readout means for reading out said outputs accumulated in said first accumulation means in a predetermined order.

9. An image pickup apparatus according to claim 8, wherein said readout means further reads out the output accumulated in said second accumulation means.

10. An image pickup apparatus according to claim 7, wherein said first and second accumulation means include capacitors, respectively.

11. An image pickup apparatus according to claim 1, wherein said first output means includes a differential amplifier.

12. An image pickup apparatus according to claim 1, wherein said first output means is formed by commonly connecting the second emitter of said photoelectric conversion element which is shielded from light to the commonly connected first emitters of said plurality of photoelectric conversion elements which are irradiated by the incident light.

13. An image pickup apparatus according to claim 1, further comprising control means for controlling an interval of accumulating charge in the base of a photoelectric conversion element which is irradiated by the incident light.

14. An image pickup apparatus according to claim 1, further comprising exposure control means for limiting an amount of light incident upon said plurality of photoelectric conversion elements which are irradiated by the incident light.

15. An image pickup apparatus according to claim 14, further comprising means for controlling the amount of the incident light provided by said exposure control means, in response to the signal output by said first output means.

16. A photoelectric conversion device comprising:
(a) a plurality of photoelectric conversion elements which are irradiated by incident light, and at least one photoelectric conversion element which is shielded from the incident light, each of said photoelectric conversion elements comprising a transistor including a base, a collector and first and second emitters; and
(b) first output means for commonly connecting first emitter of (a) said plurality of photoelectric conversion elements which are irradiated by the incident light and (b) said photoelectric conversion element which is shielded from the incident light.

17. A device according to claim 16, further comprising first accumulation means for respectively accumulating outputs of the second emitters of said plurality of photoelectric conversion elements which are irradiated by the incident light.

18. A device according to claim 17, further comprising readout means for reading out the outputs accumulated in said first accumulation means in a predetermined order.

19. A device according to claim 18, further comprising signal processing means for processing a signal read out from said first accumulation means.

20. A device according to claim 19, further comprising means for controlling a gain of said signal processing means according to an output of said first output means.

21. A device according to claim 17, wherein said first accumulation means includes a capacitor.

22. A device according to claim 17, further comprising second accumulation means for accumulating an output of the second emitter of said photoelectric conversion element which is shielded from light.

23. A device according to claim 22, further comprising readout means for reading out the outputs accumulated in said first accumulation means in a predetermined order.

24. A device according to claim 23, wherein said readout means further reads out the output accumulated in said second accumulation means.

25. A device according to claim 22, wherein said first and second accumulation means include capacitors, respectively.

26. A device according to claim 16, further comprising control means for controlling, in response to an output of said first output means, an interval of accumulating charge in the base of the photoelectric conversion element which is irradiated by the incident light.

27. A device according to claim 16, further comprising exposure control means for limiting an amount of light incident upon said plurality of photoelectric conversion elements which are irradiated by the incident light.

28. A device according to claim 27, further comprising means for controlling the amount of the incident light provided by said exposure control means, in response to an output of said first output means.

* * * * *

UNITED STATES PATENT AND TRADEMARK OFFICE
CERTIFICATE OF CORRECTION

PATENT NO. : 4,972,243

DATED : November 20, 1990

INVENTOR(S) : Shigetoshi SUGAWA, ET AL.

It is certified that error appears in the above-identified patent and that said Letters Patent is hereby corrected as shown below:

COLUMN 1:

Line 23, "cross" should read --cross- --;

Line 34, "other" should read --other.--; and

Line 42, "o" should read --on--.

COLUMN 2:

Line 4, "of both" should read --or both--.

COLUMN 3:

Line 11, "conventional" should be deleted.

COLUMN 4:

Line 33 "a" should read --an--; and

UNITED STATES PATENT AND TRADEMARK OFFICE
CERTIFICATE OF CORRECTION

PATENT NO. : 4,972,243          Page 2 of 2

DATED : November 20, 1990

INVENTOR(S) : Shigetoshi SUGAWA, ET AL.

It is certified that error appears in the above-identified patent and that said Letters Patent is hereby corrected as shown below:

Line 61, "terminals 103" should read --terminal 103--.

COLUMN 8:

Line 4, "emitter" should read --emmitters--.

Signed and Sealed this

Twentieth Day of October, 1992

*Attest:*

DOUGLAS B. COMER

*Attesting Officer*      *Acting Commissioner of Patents and Trademarks*